United States Patent [19]

Jackson

[11] Patent Number: 5,087,809
[45] Date of Patent: Feb. 11, 1992

[54] SPECTRALLY SELECTIVE DITHERING AND COLOR FILTER MASK FOR INCREASED IMAGE SENSOR BLUE SENSITIVITY

[75] Inventor: Todd A. Jackson, Pittsford, N.Y.

[73] Assignee: Eastman Kodak Company, Rochester, N.Y.

[21] Appl. No.: 617,731

[22] Filed: Nov. 26, 1990

[51] Int. Cl.$^5$ .............................................. G01J 3/50
[52] U.S. Cl. ........................................ 250/226; 358/44
[58] Field of Search ................ 250/226, 211 R, 211 J; 350/316; 358/41–44

[56] References Cited

U.S. PATENT DOCUMENTS

| | | | |
|---|---|---|---|
| 4,355,087 | 10/1982 | Martin | 358/44 |
| 4,395,629 | 7/1983 | Sasano et al. | 250/226 |
| 4,481,530 | 11/1984 | Wagesonner et al. | 358/44 |
| 4,547,074 | 10/1985 | Hinoda et al. | 250/226 |
| 4,710,803 | 12/1987 | Suzuki et al. | 358/44 |
| 4,827,118 | 5/1989 | Shibata et al. | 250/226 |
| 4,965,449 | 10/1990 | Suzuki et al. | 250/226 |

Primary Examiner—David C. Nelms
Assistant Examiner—S. Allen
Attorney, Agent, or Firm—Edward Dugas

[57] ABSTRACT

An improved method of operating a color scanning system of the type that incorporates a monochrome image sensor having at least one photosensitive area that is sequentially exposed to individual colors of a scene and to a dithering of the scene with respect to the image sensor photosensitive area is described along with an improved color filter mask for the at least one photosensitive area. The blue filter mask is formed over a portion the photosensitive area, for example, an L-shaped portion, that covers approximately 75% of the photosensitive area. The method of operation is to first image and dither a red filtered version of the scene onto the photosensitive area to generatr a red image signal. Next a green filtered version of the scene is imaged and dithered onto the photosensitive area to generate a green image signal, and lastly a blue filtered version of the scene is imaged onto the photosensitive area without dithering to generate a blue image signal. The photosensitive area generates an electrical signal from it's full area in this mode, because the blue masking material is transparent to the blue image.

3 Claims, 2 Drawing Sheets

SPECTRALLY SELECTIVE DITHERING AND COLOR FILTER MASK FOR INCREASED IMAGE SENSOR BLUE SENSITIVITY

FIELD OF INVENTION

The present invention is related to the field of color image sensors and more particularly to a multi-element solid state color sensor having a color filter mask mounted thereon and an associated dithering method.

BACKGROUND OF THE INVENTION

In the image sensor art there is a continual drive towards increasing the resolution of the image sensor so that in turn higher resolution hard and soft copies of the sensed images can be formed. One of the techniques that has received wide spread use in the digital image processing industry involves a process called dithering. The term was first used to define a periodic controlled jitter type motion that was applied to servo motors to decrease the stiction effect between mechanical pieces. In the image processing art the term is used to describe the movement of an image carrying beam from a reference scanning path for a first pass over the image sensor to a displaced path for a second pass. The displacement between the two paths is fixed such that the portion of the image, formed in the beam, that impinges onto the spacing between each of the photosensitive elements that form the sensor array on the first pass impinges on the photosensitive elements on the second or subsequent passes. The process of dithering is thus employed to increase the effective resolution of an image sensor. Another way to conceptualize the basic process is one wherein a small single sensor is moved to different positions on an image thereby collecting data at each position. Such a process is shown pictorially in FIG. 1. This process can be extended to image sensors which are composed of a regular matrix array of individual photosensitive elements. In a typical two-dimensional dithering application, each individual sensor in a matrix array is employed to obtain information at each of four non-overlapping adjacent picture elements (pixels). Since four times as much information is gathered as there are elements in the imager, the effective resolution of the imager is multiplied by four.

Two-dimensional dithering is performed straightforwardly when the photosensitive area of the sensor elements used to acquire each pixel of an image are square and the imager has a fill factor of $(100\%)/n^2$ where n is an integer. For example, when $n=2$, the sensor has a fill factor of 25%, and non-overlapping adjacent pixel locations are readily obtained in the image with two-dimensional dithering.

When one desires to increase the resolution of an imager possessing either a high fill factor and/or non-square sensor elements, one typically masks off a portion of the photosensitive area in each of the individual sensor elements to achieve the proper fill factor and a square aspect ratio. This is illustrated in FIG. 2a and 2b. One consequence of this masking is a reduction in the imager sensitivity proportional to the percentage of the masked area of the sensors. This is especially of concern for CCD imagers which typically exhibit a low sensitivity in the blue (400–500 nM) part of the visible spectrum.

In U.S. Pat. No. 4,710,803 entitled "Color Filter and Color Image Sensor Using the Same" by Suzuki et al. there is disclosed a color sensor array wherein the photosensitive elements representing a pixel element are covered with three L-shaped filter masks representing the primary colors R, G, and B. This configuration is urged for saving electrical wiring and for providing a more consistent exposure of each of the individual filter masked elements to the same portion of the original image.

Another patent of interest for its teaching in this area is U.S. Pat. No. 4,481,530 entitled "Color Filter Arrangement for Optoelectric Converting Device" by Wagensonner et al. In that patent it is recognized that the area of a photosensitive element assigned to collect the green components of an image has to be different in size than the area assigned for the blue and red and in a like manner the red area has to be different in size from the blue. The main reason for this difference is that the photosensitive elements forming the sensor respond to the different frequencies of light in a different manner, i.e. green light provides a greater electrical output than for example blue light. Another reason for this difference is that the human eye also does not treat each of the colors with the same degree of responsiveness. A color image formed from equally weighted sensor signals would therefor not appear correct to the human eye. Although the referenced patent deals with the responsiveness of the photosensitive material to the frequency of the impinging light by adjusting the area of each sensor according to the color it is to detect, it would also be obvious that the area can be held constant and that the signals from each sensing element could be weighted to provide the same effect.

SUMMARY OF THE INVENTION

The preferred embodiment of the present invention is directed towards providing a high blue sensitivity CCD imager particularly adapted for use in a system that captures color images one color at a time using a dithering feature. Recognizing that the acutance of the human visual system (HVS) in the blue part of the spectrum is about 1/20th that of its red and green acutance. It thus follows, that one may suffer no loss of image sharpness by not dithering when acquiring the blue image information as the HVS cannot perceive the increased resolution. With this in mind, an improved CCD image sensor would have close to a 100% fill factor which would then be reduced to a 25% fill factor using a blue transmittance filter as a mask. Thus, when acquiring blue information from the image sensor without dithering, the filter/mask is transparent and the image sensor sensitivity is high since a larger area of the image sensor is active. When acquiring red or green image information, the filter/mask blocks the light reducing the active image sensor area thereby allowing dithering to be performed.

From the foregoing it can be seen that a primary object of the present invention is the provision of an improved color image sensor.

It is a further object of the present invention to provide a color image sensor which is particularly adapted to be used in a dithering scheme.

It is yet another object of the present invention to provide an image sensor that sports an effectively increased area for blue light while maintaining the effective areas for red and green light at a lesser and substantially equal value.

These and other objects of the present invention will become more apparent when taken in conjunction with the following description and drawings wherein like characters indicate like parts and which drawings form a part of the present specification.

DESCRIPTION OF THE PREFERRED EMBODIMENTS

Figure 1:
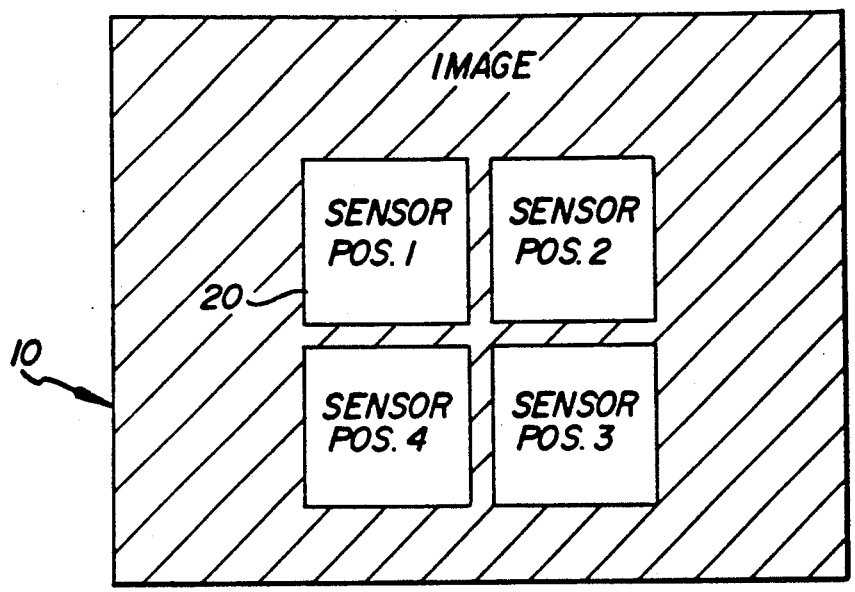
FIG. 1 illustrates the positioning of one square photosensitive element in four positions with respect to an image.

Referring to FIG. 1, the technique of dithering is illustrated with an image sensor element 20 being shown positioned sequentially in four positions. At each position the image sensor element is activated to capture that portion of the image that is within its field of view. The state of the art is such that the image sensor and the image do not have to be moved but instead the illumination (scanning) beam reflecting from the image is deflected by a deflecting device such as a rotating mirror to effectively achieve the desired repositioning of the image sensor with respect to the image. Although only one image sensor element is shown it is well known that there are a large number of such elements that are used to form a complete image sensor and that the showing of one is only for the purpose of simplicity. In a complete image sensor the elements are photosensitive devices such as diodes which are deposited next to each other in matrix array with each device providing an electrical signal output to a CCD as a function of the intensity of the light impinging thereon. Each photosensitive device has a photosensitive area for receiving the light.

Figure 2A:
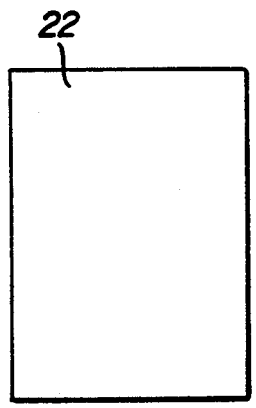
FIGS. 2a and 2b illustrate a rectangular sensor element, and an L-shaped blue filter mask positioned over the rectangular sensor-element of FIG. 2a, respectively.
Figure 2B:
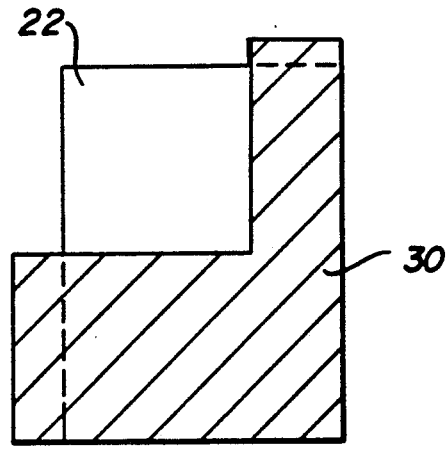
Figure 3:
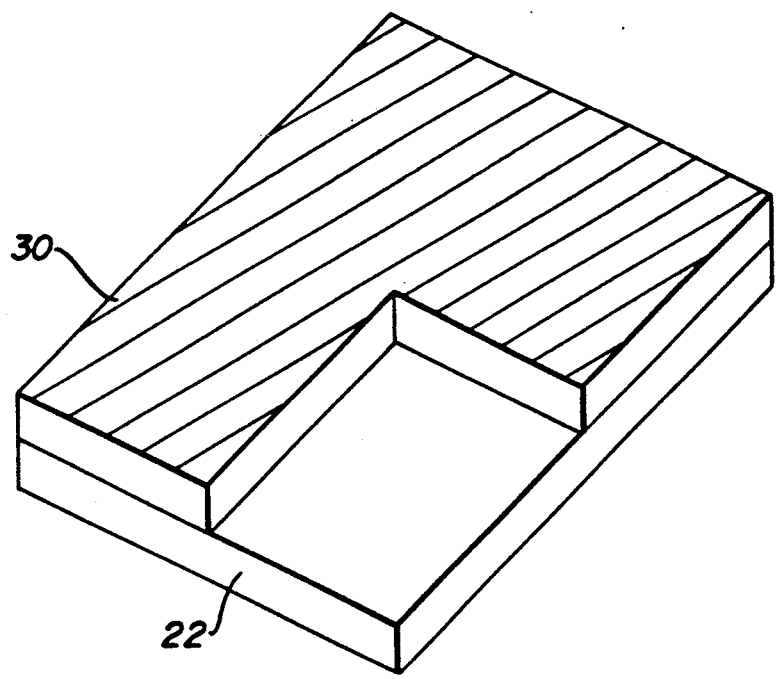
FIG. 3 is a perspective view of the rectangular sensor and the L-shaped filter mask shown in FIG. 2.

FIG. 2A illustrates a rectangular image sensor's photosensitive area 22. In FIG. 2B the photosensitive area 22 is masked to a square area, approximately 25% of the total area, by the use of a blue filter mask 30. FIG. 3 illustrates the arrangement in perspective view.

In the preferred embodiment of the invention the L-shaped blue filter mask material is positioned over each of the photosensitive elements that form the image sensor. An acceptable masking material is any material with a high transmissivity in the 400-500 nm wavelength range and low transmissivity elsewhere. Such a material is described as an organic blue dye in U.S. Pat. No. 4,355,087, Columns 8 and 9. The teachings of that patent are incorporated into the present Application, by reference.

In the method of operation of the present invention, the blue image is formed by passing the image beam through a blue transmitting filter and onto the imager. The imager's photosensitive elements acquire image information through their L-shaped blue masked areas and the unmasked areas. Since the photosensitive areas are adjacent, the fill factor is 100% and sensitivity is high. Dithering is not performed.

The green image is formed by passing the image beam through a green transmitting filter and onto the imager. The individual blue L-shaped masks on the photosites are non-transmitting to the green image beam so that only the non-masked areas of the photosensitive elements receive the image. Dithering is then performed to acquire the green image information with increased resolution.

The red image is formed in the same way as is the green image except that the image beam is passed through a red transmitting filter onto the imager. The filters that are passed in front of the imager's photosensitive elements may be mounted in a filter wheel of the type described in U.S. Pat. No. 4,967,264, entitled "Color Sequential Optical Offset Image Sampling System" by Parulski et al. The teachings of that patent are incorporated herein by reference along with the teachings of U.S. Pat. Nos. 4,638,371 and 4,755,876. The aforementioned three patents are assigned to Eastman Kodak Co. as is the present Application. The signals generated by the photosensitive elements are then combined by apparatus and methods well known to persons in the art to form through a display and or printing device a viewable color image.

While there has been disclosed what is considered to be the preferred embodiment of the invention, it will be manifest that many changes and modifications may be made therein without departing from the essential spirit of the invention. It is intended, therefore, in the annexed claims to cover all such modifications as may fall within the true spirit of the invention.

I claim:

1. An improved method of operating a color scanning system of the type that incorporates a monochrome image sensor having at least one photosensitive area that is sequentially exposed to individual colors of a scene and to a dithering of the scene with respect to the image sensor photosensitive area comprising the steps of:

forming a blue filter mask over a portion said photosensitive area;
  imaging and dithering a red filtered version of said scene onto said photosensitive area to generate a red image signal;
  imaging and dithering a green filtered version of said scene onto said photosensitive area to generate a green image signal; and
  imaging a blue filtered version of the scene onto the photosensitive area, without dithering, to generate a blue image signal.

2. The method according to claim 1 wherein said blue filter mask is formed in an L-pattern over a rectangular photosensitive area to form an unmasked square photosensitive area.

3. The method according to claim 1 wherein said blue mask covers approximately 75% of the photosensitive area.

* * * * *